(12) United States Patent
Glenn

(10) Patent No.: US 6,246,566 B1
(45) Date of Patent: Jun. 12, 2001

(54) ELECTROSTATIC DISCHARGE PROTECTION PACKAGE AND METHOD

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/246,574

(22) Filed: Feb. 8, 1999

(51) Int. Cl.[7] ........................................ H01G 3/00
(52) U.S. Cl. ...................... 361/220; 206/710; 206/719
(58) Field of Search ................................ 361/212, 220, 361/760, 761, 764, 767, 768, 780, 719, 720; 174/52.1–52.4; 206/709, 710, 719

(56) References Cited

U.S. PATENT DOCUMENTS

| | | | |
|---|---|---|---|
| 4,290,052 | 9/1981 | Eichelberger et al. | 340/365 C |
| 4,353,056 | 10/1982 | Tsikos | 340/146.3 E |
| 4,543,564 | 9/1985 | Audoin et al. | 340/365 C |
| 4,582,985 | 4/1986 | Löfberg | 235/380 |
| 5,490,040 | * 2/1996 | Gaudenzi et al. | 361/773 |
| 5,633,533 | * 5/1997 | Andros et al. | 361/719 |
| 5,819,403 | 10/1998 | Crane, Jr. et al. | 29/841 |
| 5,824,950 | 10/1998 | Mosley et al. | 174/52.4 |
| 5,862,248 | 1/1999 | Salatino et al. | 382/124 |

FOREIGN PATENT DOCUMENTS

| | | | |
|---|---|---|---|
| 0 789 334 | 8/1997 | (EP) | G07C/9/00 |
| 62-145741 | 6/1987 | (JP) | H01L/21/82 |
| 02244125 | 9/1990 | (JP) | G02F/1/136 |
| 03266186 | 11/1991 | (JP) | G06F/15/62 |
| 08201204 | 8/1996 | (JP) | G01L/9/12 |
| 08305832 | 11/1996 | (JP) | G06T/1/00 |

OTHER PUBLICATIONS

IBM Technical Disclosure Bulletin, "Biometric Access Control In A Personal Computer System" vol. 41 (Jan. 1998).
Internet printout of Model FPS110 fingerprint scan chip, downloaded Nov. 17, 1999 from Veridicom.com website (Initial publication date unknown).

* cited by examiner

Primary Examiner—Ronald W. Leja
(74) Attorney, Agent, or Firm—Skjerven Morrill MacPherson LLP; Theodore P. Lopez

(57) ABSTRACT

A package includes a substrate mechanically supporting circuitry. A conductive cover (e.g., a metal sheet) is over the circuitry so that the circuitry is exposed below an opening in the conductive cover. A bent down corner of the conductive cover is inserted into a hole in the substrate. A solder ball is placed on the other end of the hole. During a subsequent heating, the solder ball is drawn up through the hole. When cooled, the conductive material grasps onto the tip of the bent down corner, thereby establishing a good connection between the conductive cover and the newly formed conductive via. As a finger approaches the circuitry (e.g., a fingerprint detection circuit), the finger first discharges electrostatic charge into the cover, not into the circuit, thereby protecting the circuit. In another package, the cover is composed of a highly resistive material, to slowly dissipate the electrostatic charge. Thus, the induced parasitic currents in the circuit are relatively low and damage to the circuit is avoided.

17 Claims, 5 Drawing Sheets

ELECTROSTATIC DISCHARGE PROTECTION PACKAGE AND METHOD

FIELD OF THE INVENTION

The present invention relates to packaging technology, and more specifically, to an electrostatic discharge protection package and method.

BACKGROUND OF THE INVENTION

Electrostatic discharge ("ESD") is the flow of electrostatic charge from a charged object. For example, a capacitor experiences ESD from one capacitor terminal to the other if the accumulated charge, and thus the voltage, across capacitor terminals is sufficiently large.

One source of ESD is, for example, the finger of a human being. As human beings engage in every day activities, electrostatic charge often accumulates in their bodies. This electrostatic charge is discharged from, for example, the finger when the finger contacts another object capable of receiving the charge. ESD can be damaging if the receiving object is circuitry containing minute wires, such as in, for example, VLSI and ULSI circuits. Fortunately, most circuits are protected by packaging and/or computer cases to avoid direct human contact. However, other circuits are not isolated from direct human contact or contact with other objects capable of accumulating electrostatic charge.

Therefore, what is desired is a package and packaging method for ESD protection in circuits that are not isolated from objects capable of accumulating electrostatic charge.

SUMMARY OF THE INVENTION

In accordance with one embodiment of the present invention, a package includes a substrate. Circuitry sensitive to electrostatic discharge is formed on a device mounted to the substrate. The circuitry may be, for example, VLSI or ULSI circuitry having minute wires that are damaged by even very low currents.

A conductive cover is positioned over the circuitry so that the circuitry is exposed below an opening of the conductive cover. The conductive cover may be, for example, a rectangular metal sheet having a rectangular hole in its center, the rectangular hole positioned above the circuitry. A portion of the conductive cover, such as a bent down corner of the conductive cover, is inserted into a conductive via. In one embodiment, each of the four corners of the rectangular conductive cover is bent down and the tips of the four corners are inserted within a corresponding conductive via.

In a method of fabricating a package, the conductive via is formed by inserting the portion (e.g., the bent down corner prong) of the conductive cover into the upper portion of a hole formed through the substrate. A conductive ball (e.g., a metal solder ball) is formed on the lower portion of the hole. During a subsequent heating step, the conductive material of the conductive ball is drawn up into the hole due to capillary forces, thereby forming the conductive via. The conductive material molds around the bent down corner prong. When the conductive via cools, the conductive material grasps the corner prong, thereby establishing a reliable electrical and mechanical connection between the conductive cover and the conductive via.

As a finger, or other object capable of accumulating electrostatic charge, approaches the circuitry, the finger first contacts the conductive cover, thereby draining the electrostatic charge in the finger. When the finger contacts the circuitry, electrostatic charge does not discharge from the finger into the circuit. Thus, the circuit is protected from electrostatic discharge.

In accordance with another embodiment of the invention, a package includes a substrate. Circuitry is formed on a device which is mounted to the substrate. A cover is positioned with respect to the substrate such that an opening of the cover lies over the circuitry. The cover is composed of a highly resistive material which dissipates (i.e., slowly conducts) the electrical charge it receives through a conductive via and into a charge drain. The cover may be, for example, a dissipative ring deposited around the circuitry and may be composed of an epoxy resin with conductive fillers.

The resistance between the charge drain and a contact surface of the cover for contact with a finger is relatively high (e.g., approximately 1000 ohms). Since the electrostatic charge drains relatively slowly from the cover, induced parasitic currents within the circuitry are relatively low and thus the circuitry is less likely to be damaged by induced parasitic currents.

These and other objects, features and advantages of the present invention will be more readily apparent from the detailed description of the various embodiments set forth below taken in conjunction with the accompanying drawings.

DETAILED DESCRIPTION OF THE PREFERRED EMBODIMENTS

Several elements in the following figures are substantially similar. Therefore, similar reference symbols are used to represent substantially similar elements.

Package 100 is first generally described with reference to FIGS. 1A, 1B and 1C. Subsequently, the details of package 100 are described with reference to the fabrication steps of FIGS. 2A, 2B, 2C, 2D, 3A, 3B and 4.

Figure 1A:
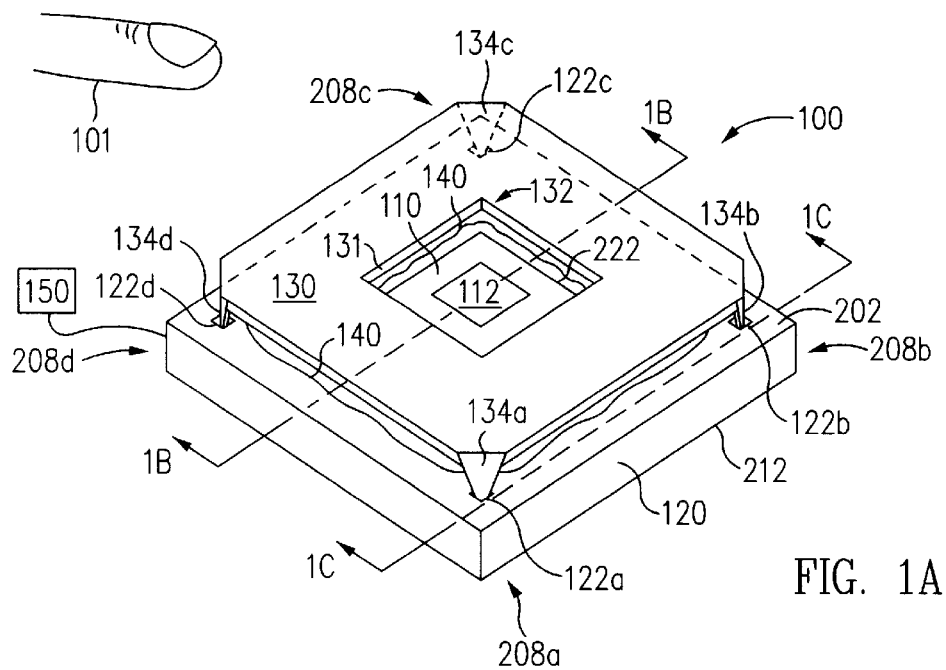
FIG. 1A is an isometric view of a finished package according to a first embodiment of the present invention.
Figure 1B:
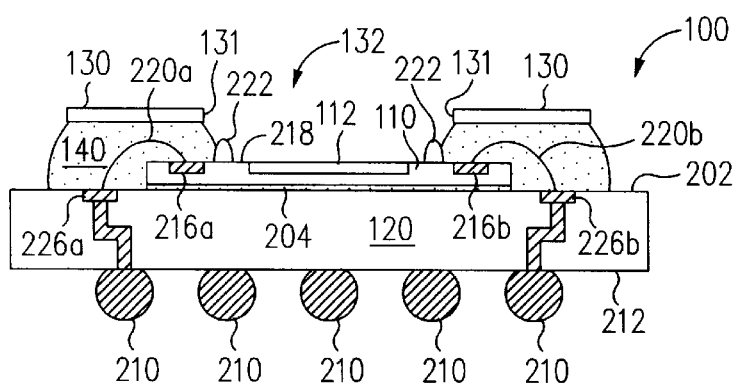
FIG. 1B is a cross sectional view of the package of FIG. 1A along cross section line 1B—1B of FIG. 1A.
Figure 1C:
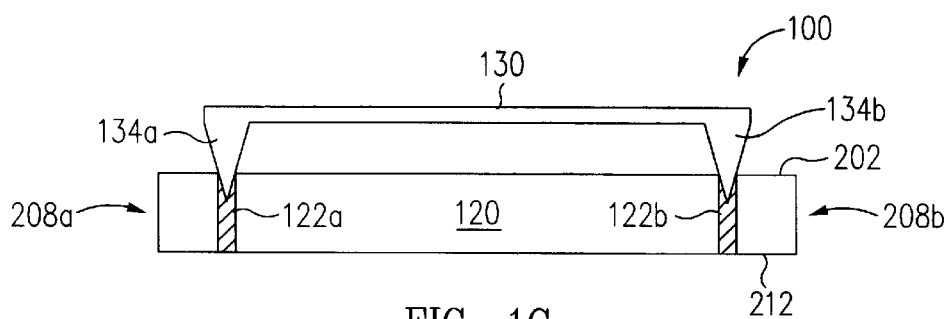
FIG. 1C is a cross sectional view of the package of FIG. 1A along cross section line 1C—1C of FIG. 1A.

Referring to FIGS. 1A, 1B and 1C, package 100 includes a device 110 mounted on a substrate 120. Device 110 contains circuitry 112 which is sensitive to electrostatic discharge ("ESD"), and which will not be isolated from contact with an object capable of accumulating electrostatic charge. Circuitry 112 may be, for example, a fingerprint detection circuit onto which a user is to press a finger 101 (FIG. 1A).

A conductive cover 130 overlies the periphery of device 110 and has a contact surface 131 defining an opening 132 such that circuitry 112 is exposed under opening 132. Conductive cover 130 may be, for example, a copper plate.

Conductive cover 130 is structurally supported by prongs 134a, 134b, 134c and 134d disposed in corresponding conductive vias 122a, 122b, 122c and 122d in substrate 120. These conductive vias 122a, 122b, 122c and 122d are contact terminals configured to be electrically coupled to a charge drain 150 (e.g., a ground or fixed voltage mechanism). Conductive cover 130 may also be structurally supported by electrically insulating insulation ring 140. Conductive cover 130 is coupled to a charge drain 150 through prongs 134a, 134b, 134c and 134d such that when charge develops on any part of conductive cover 130 (e.g., contact surface 131), that charge is conducted to charge drain 150.

During operation, as finger 101 moves toward circuit 112, finger 101 contacts conductive cover 130 at contact surface 131 (FIG. 1A) which receives the electrostatic charge from finger 101. After contacting conductive cover 130, the electrostatically discharged finger contacts circuitry 112.

Having described the general features of package 100, the details of package 100 may best be understood by describing the method of fabricating package 100 as follows.

Figure 2A:
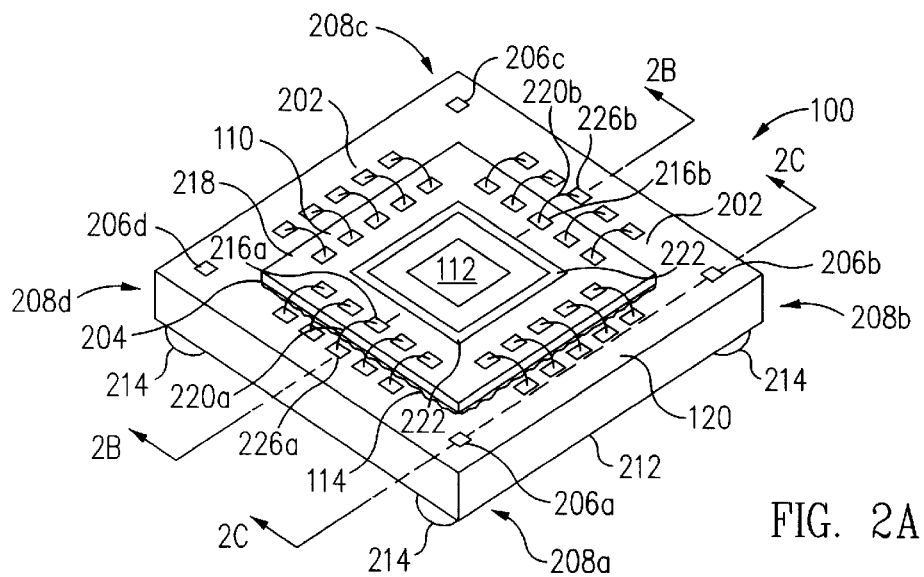
FIG. 2A is an isometric view of the package of FIG. 1A after an initial stage of packaging.
Figure 2B:
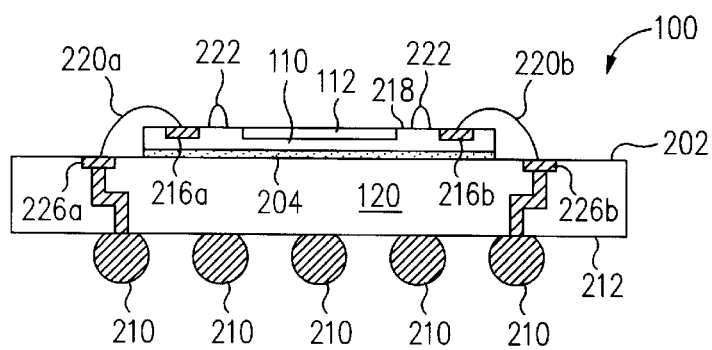
FIG. 2B is a cross sectional view of the package of FIG. 2A along cross section line 2B—2B of FIG. 2A.
Figure 2C:
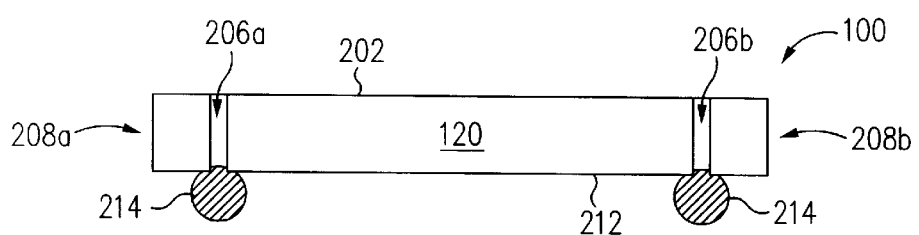
FIG. 2C is a cross sectional view of the package of FIG. 2A along cross section line 2C—2C of FIG. 2A.

Referring to FIGS. 2A, 2B and 2C, device 110 is mounted to an upper surface 202 of a substrate 120 of package 100. Device 110 may be attached to substrate 120 using, for example, a conventional adhesive 204.

Substrate 120 may be any substrate capable of mechanically supporting device 110. Substrate 120 may have hollow vias 206a, 206b, 206c, and 206d formed through respective corner regions 208a, 208b, 208c and 208d of substrate 120. A corresponding one of conductive balls 214 is formed below at least one, but possibly all, of hollow vias 206a, 206b, 206c and 206d. FIG. 2C, for example, shows two conductive balls 214 formed below each of hollow vias 206a and 206b.

Substrate 120 has terminals 210 which may be, for example, solder balls formed in or on a lower surface 212 of substrate 120. Conductive balls 214 and terminals 210 may be deposited on lower surface 212 at the same time. Conductive balls 214 are ultimately drawn up, in a subsequent high temperature process, through hollow vias 206a, 206b, 206c and 206d due to capillary forces. Conductive balls 214 may be, for example, 0.35 inch diameter, composed of an alloy of 63% lead and 37% tin.

Substrate 120 has contact regions, such as bond pads (for clarity, only bond pads 226a and 226b are labeled), formed on, for example, upper surface 202 of substrate 120. Device 110 has corresponding contact regions, such as bond pads (for clarity, only bond pads 216a and 216b are labeled), which may be formed on an upper surface 218 of device 110.

Bond pads 226a and 226b of substrate 120 may be electrically coupled to one or more corresponding terminals 210 provided on substrate 120. Bond pads 216a and 216b are coupled to circuitry 112 within device 110.

Figure 2D:
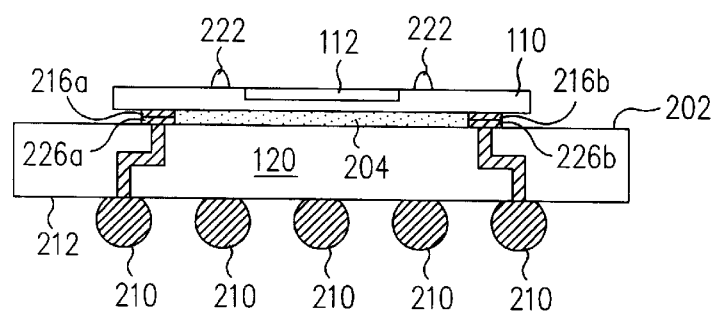
FIG. 2D is a cross sectional view of an alternative embodiment of the package of FIG. 2A in a flip chip configuration.

Leads, such as bond wires 220a and 220b, electrically couple bond pads 216a and 216b to respective bond pads 226a and 226b. Alternatively, device 110 is electrically connected to substrate 120 in a leadless fashion such as shown in cross section in FIG. 2D. Referring to FIG. 2D, contact regions 216a and 216b formed on a bottom surface of device 110 directly contact contact regions 226a and 226b, respectively, of substrate 120.

Referring back to FIGS. 2A, 2B and 2C, after wire bonding, a small dam structure 222 of a fluid is deposited using, for example, a dispense system such as an MRSI 375-3S dispenser produced by MRS Technology, Inc., located at 10 Elizabeth Drive, Chemlsford, Mass. This fluid may be, for example, Hysol 4323. Dam structure 222 is deposited to circumscribe circuitry 112 of device 110 and may circumscribe as a square.

FIG. 2B shows that the cross sectional profile of dam structure 222 need not be large. However, the profile should be significant enough to contain later deposited material (e.g., insulation ring 140 described hereinafter) from overflowing dam structure 222 and contacting circuitry 112. The dimensions of dam structure 222 may be, for example, 0.010 inches by 0.010 inches.

Figure 3A:
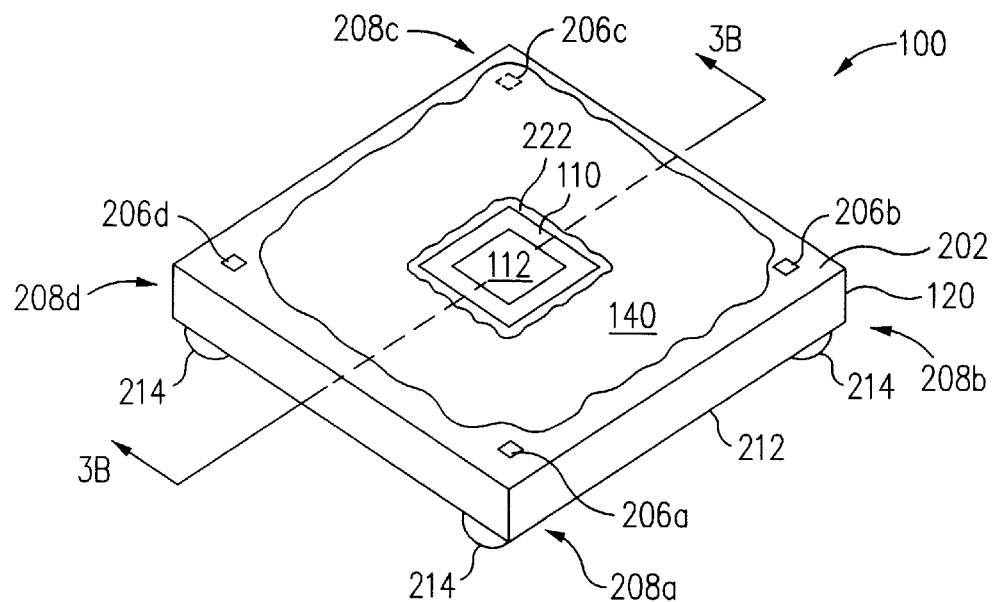
FIG. 3A is an isometric view of the package of FIG. 2A after a subsequent stage of fabrication.
Figure 3B:
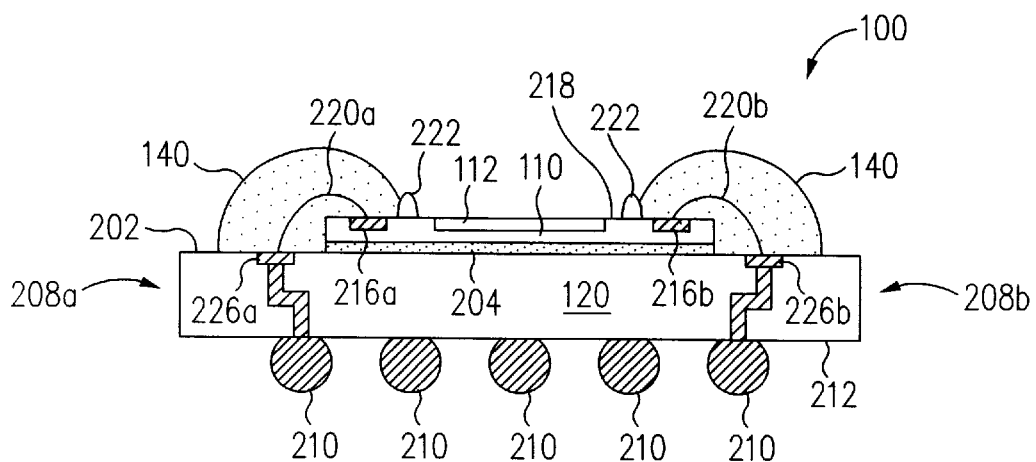
FIG. 3B is a cross sectional view of the package of FIG. 3A along cross section line 3B—3B of FIG. 3A.

FIG. 3A is an isometric view of the package of FIG. 2A after a subsequent stage of fabrication. FIG. 3B is a cross sectional view of the package of FIG. 3A along cross section line 3B—3B of FIG. 3A.

Dam structure 222 is gelled by exposure to a temperature of approximately 150° C. for approximately 30 minutes under ultraviolet radiation. After dam structure 222 is gelled, insulation ring 140, composed of a fluid that is electrically insulating (e.g., epoxy) and that has a moderate viscosity is deposited around the periphery of device 110 using, for example, the MRSI 375-3S dispenser. Insulation ring 140 is deposited to cover leads 220a and 220b and upper surface 218 of device 110 up to dam structure 222. Although overflow of insulation ring 140 over dam structure 222 is not aesthetically pleasing, some overflow may occur so long as the functionality of circuitry 112 does not significantly deteriorate.

Figure 4:
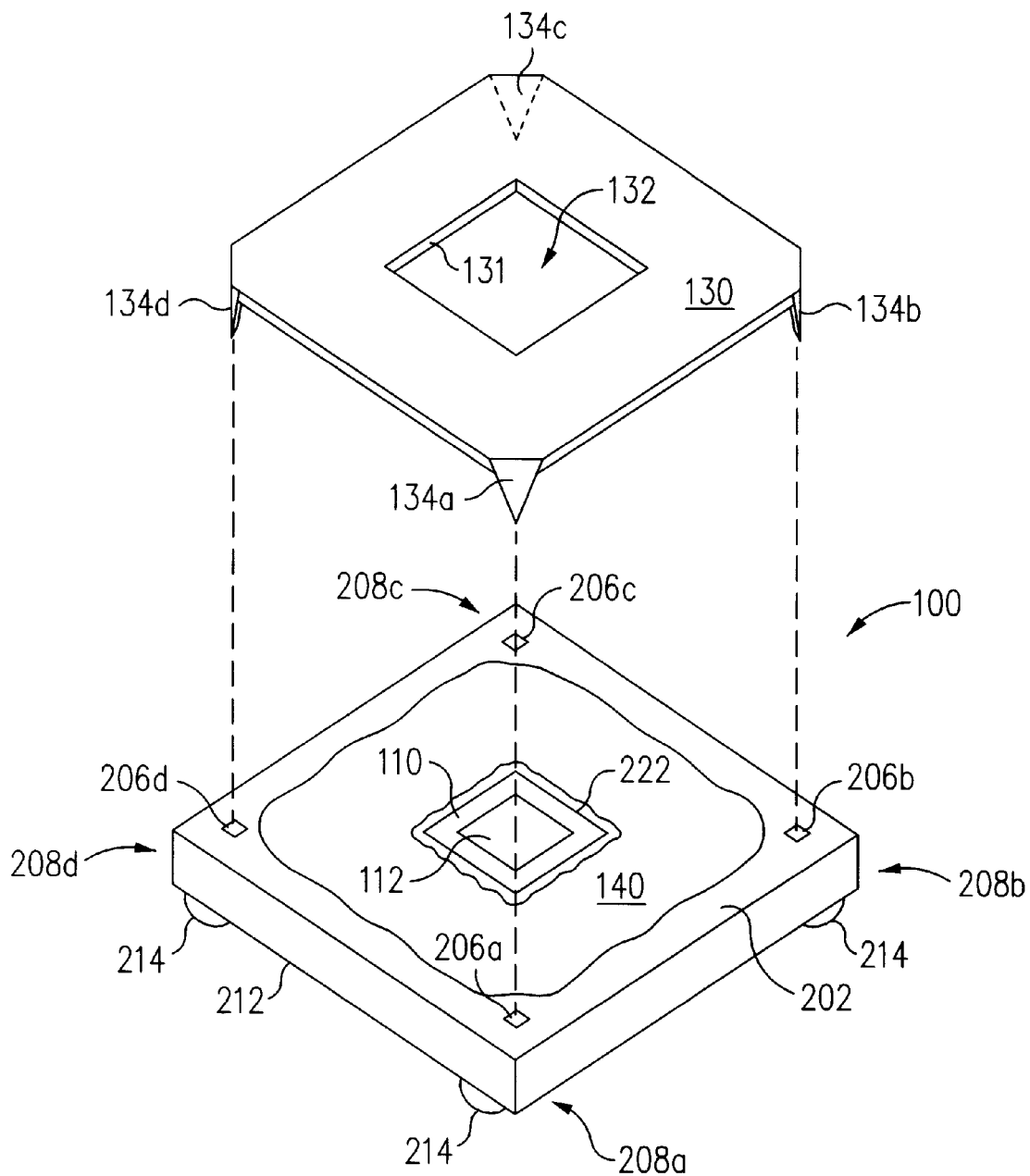
FIG. 4 is an exploded isometric view of the package of FIG. 3A after a subsequent step of fabrication.

FIG. 4 is an exploded isometric view of the package 100 after a subsequent stage of fabrication. Insulation ring 140 is gelled by exposure to a temperature of approximately 150° C. for approximately 1 hour. Conductive cover 130 is then deposited over substrate 120. Conductive cover 130 is shaped like a rectangular plate having a rectangular opening 132 formed in the approximate center of the plate. The corners of conductive cover 130 are bent approximately ninety degrees downward to form prongs 134a, 134b, 134c and 134d. The tips of each prong 134a, 134b, 134c and 134d are inserted into a respective hollow via 206a, 206b, 206c and 206d.

The insulation ring 140 and dam structure 222 are further cured at a temperature of approximately 170° C. for approximately 1 hour. During this curing, referring now to both FIG. 2C and FIG. 4, conductive balls 214 melt and are pulled into hollow vias 206a, 206b, 206c and 206d and around the tips of prongs 134a, 134b, 134c and 134d due to capillary forces. The material is cooled to form conductive vias 122a, 122b, 122c and 122d as shown in FIG. 1C. This cooling causes the conductive vias 122a, 122b, 122c and 122d to grasp onto respective prongs 134a, 134b, 134c and 134d, thereby forming a strong electrical and mechanical connection between the conductive cover 130 and the conductive vias 122a, 122b, 122c and 122d. The resulting package is shown in FIGS. 1A, 1B and 1C.

In some applications, quickly conducting the charge from conductive cover 130 may result in damage to circuitry 112.

For example, a rapid voltage drop in conductive cover 130 might induce enough current in circuitry 112 to damage the minute wires of circuitry 112. In a second embodiment described with reference to FIGS. 5A, 5B and 5C, charge is slowly dissipated from a cover rather than quickly conducted from the cover.

Figure 5A:
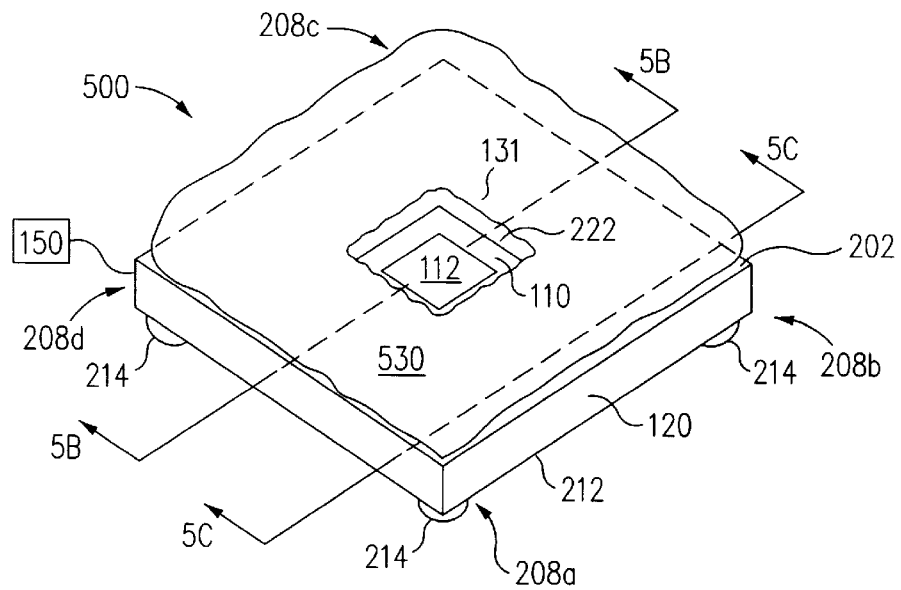
FIG. 5A is an isometric view of a package according to a second embodiment of the invention.
Figure 5B:
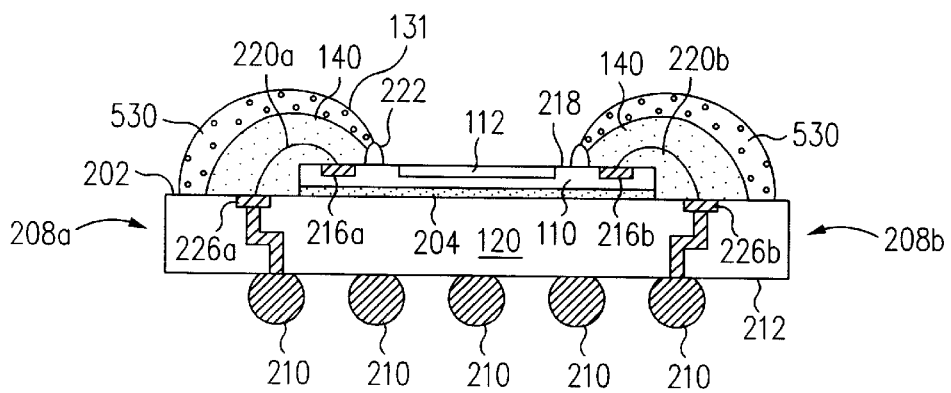
FIG. 5B is a cross sectional view of the package of FIG. 5A along cross section line 5B—5B of FIG. 5A.
Figure 5C:
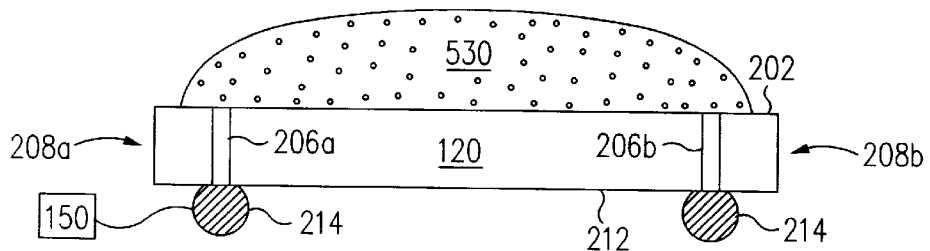
FIG. 5C is a cross sectional view of the package of FIG. 5A along cross section line 5C—5C of FIG. 5A.

FIG. 5A is an isometric view of a dissipative package 500 according to a second embodiment of the invention. FIGS. 5B and 5C are a cross sectional views of dissipative package 500 of FIG. 5A along respective cross section lines 5B—5B and 5C—5C of FIG. 5A.

Dissipative package 500 is structured similar to package 100. However, dissipative package 500 contains a dissipative ring 530 instead of conductive cover 130 of package 100. Furthermore, instead of conductive balls 214 being drawn through hollow vias 206a, 206b, 206c and 206d, some dissipative ring 530 material is pull into hollow vias 206a, 206b, 206c and 206d to form vias 122a, 122b, 122c and 122d.

Dissipative ring 530 is deposited using, for example, the MRSI 375-3S dispenser. Dissipative ring 530 has a relatively low viscosity. Small dam structure 222 at least substantially prevents dissipative ring 530 from overflowing onto circuit 112. Curing of dissipative ring 530 takes place at a temperature of approximately 175° C. for approximately 1 hour.

The total electrical resistance from the dissipative ring 530 to the charge drain 150 depends on the conductivity of dissipative ring 530. In one embodiment, dissipative ring 530 is an epoxy resin having conductive fillers (25% aluminum and 45% carbon).

In package 500, when a finger 101 contacts contact surface 131, charge is not quickly conducted from dissipative ring 530, but is slowly dissipated from dissipative ring 530 due to relatively high electrical resistance of the material between contact surface 131 and charge drain 150. The higher the ohmic resistance between contact surface 131 and charge drain 150, the slower the discharge to charge drain 150. In one embodiment, the electrical resistance between contact surface 131 and charge drain 150 is approximately 1000 ohms and the dissipation occurs in a matter of microseconds. However, the electrical resistance may also be 10, 100, 1000, 10000, or even 100,000 ohms or more.

Since the charge dissipates slowly from dissipative ring 530, the induced current in circuitry 112 is lowered, thereby protecting circuitry 112 from damage.

Although various specific embodiments are described above, these embodiments are illustrative only and not limiting. After having read this disclosure, one skilled in the art will recognize various modifications and variations that fall within the scope of the present invention. Thus, the invention is defined by the following claims.

I claim:

1. A package comprising:
   a substrate including a conductive via;
   circuitry coupled to the substrate; and
   a conductive cover including a contact surface defining an opening, the conductive cover positioned such that the opening is adjacent to the circuitry, a bent portion of the conductive cover being inserted into the conductive via.

2. A package comprising:
   a substrate including a conductive via;
   circuitry coupled to the substrate; and
   a conductive cover including a contact surface defining an opening, the conductive cover positioned such that the opening is adjacent to the circuitry, a portion of the conductive cover being inserted into the conductive via, said portion of the conductive cover inserted into the conductive via being a bent corner of the conductive cover.

3. The package of claim 2, further comprising a device mounted on the substrate, wherein the circuitry is formed on the device.

4. A method of fabricating a package comprising:
   providing a substrate having an upper surface and a lower surface, the substrate having a hole formed through the substrate from the upper surface, to the lower surface, circuitry being coupled to the substrate;
   positioning a conductive cover so that an opening of the conductive cover overlies the circuitry;
   inserting a portion of the conductive cover into the hole at the upper surface of the substrate;
   providing a conductive material over the hole at the lower surface of the substrate; and
   heating the conductive material, the conductive material being drawn through the hole to contact the a portion of the conductive cover, the conductive cover including a bent corner defining a prong, wherein inserting the portion of the conductive cover comprises inserting the prong into the hole.

5. The method of claim 4, further comprising:
   mounting a device onto the substrate, the device comprising the circuitry.

6. A package comprising:
   a substrate;
   circuitry coupled to the substrate; and
   a cover including a contact surface defining an opening, the cover positioned such that the opening is above the circuitry, the cover including a portion connected to a charge drain, the cover including a high resistivity material such that a resistance between the contact surface and the portion connected to the charge drain is at least 10 ohms, said high resistivity material being an epoxy resin with conductive fillers.

7. The package of claim 6, further comprising an insulation ring for electrically isolating bond pads and lead wires from the cover.

8. The package of claim 6, wherein the resistance between the contact surface and the portion of the cover connected to the charge drain is at least approximately 100 ohms.

9. The package of claim 6, wherein the resistance between the contact surface and the portion of the cover connected to the charge drain is approximately 1000 ohms.

10. The package of claim 6, further comprising:
    a device mounted to the substrate, the device comprising the circuitry.

11. The package of claim 6, wherein the resistance between the contact surface and the portion of the cover connected to the charge drain is at least approximately 1000 ohms.

12. A method of fabricating a package comprising:
    providing a substrate including circuitry;
    positioning a discharge cover such that an opening defined by a contact surface of the discharge cover is adjacent to the circuitry, the discharge cover being electrically isolated from the circuitry, a bent portion of the discharge cover being insertable into a conductive via to be coupled a charge drain, the discharge cover being composed of a high resistivity material such that a resistance between the contact surface and the portion of the discharge cover is at least 10 ohms.

13. The method of claim 12, further comprising:

electrically coupling the discharge cover to the charge drain.

14. A package comprising:

a substrate;

circuitry coupled to the substrate; and a cover being electrically isolated frost said circuitry, including a contact surface defining an opening, the cover positioned such that the opening is above the circuitry, the cover including a portion connected to a charge drain, the cover including a high resistivity material such that a resistance between the contact surface and the portion of the cover connected to the charge drain is at least 10 ohms;

the high resistivity material including an epoxy resin with conductive fillers.

15. A package comprising:

a substrate:

circuitry coupled to the substrate; and a conductive cover electrically isolated from said circuitry for discharging an object capable of accumulating electrostatic charge, wherein a portion of said conductive cover is inserted into a conductive via defined by said substrate, said portion of said conductive cover comprising a bent corner of the conductive cover.

16. The package of claim 15, further comprising a device mounted on the substrate, wherein the circuitry is formed on the device.

17. The package of claim 15, wherein said conductive cover comprises a contact surface defining an opening, the conductive cover positioned such that the opening is adjacent the circuitry.

* * * * *

UNITED STATES PATENT AND TRADEMARK OFFICE
CERTIFICATE OF CORRECTION

PATENT NO. : 6,246,566 B1
DATED : June 12, 2001
INVENTOR(S) : Thomas P. Glenn

It is certified that error appears in the above-identified patent and that said Letters Patent is hereby corrected as shown below:

Column 6,
Lines 4 and 23, delete "comer" and insert -- corner --;
Line 64, after "coupled", insert -- to --; and Column 7,
Line 7, delete "frost" and insert -- from --.

Signed and Sealed this

Twenty-eighth Day of January, 2003

JAMES E. ROGAN
*Director of the United States Patent and Trademark Office*